United States Patent
McDunn et al.

(10) Patent No.: US 6,215,166 B1
(45) Date of Patent: Apr. 10, 2001

(54) RADIO FREQUENCY ELECTRONIC DEVICE AND METHOD FOR REGULATING AN AMOUNT OF POWER DELIVERED TO A RADIO FREQUENCY ELECTRONIC DEVICE

(75) Inventors: Kevin J. McDunn, Lake in the Hills; Linda Limper-Brenner, Glenview, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/848,334

(22) Filed: Apr. 30, 1997

(51) Int. Cl.[7] .................. H01L 31/058; H01L 23/34; H05K 7/20
(52) U.S. Cl. ............... 257/467; 257/215; 361/700
(58) Field of Search .................. 257/467, 715; 361/700

(56) References Cited

U.S. PATENT DOCUMENTS

| 4,057,671 | * | 11/1977 | Shoop | 428/208 |
| 4,395,728 | * | 7/1983 | Li | 257/715 |
| 4,740,700 | * | 4/1988 | Shaham et al. | 257/467 |
| 5,220,804 | | 6/1993 | Tilton et al. | 62/64 |
| 5,270,572 | * | 12/1993 | Nakajima et al. | 257/714 |
| 5,412,536 | * | 5/1995 | Anderson et al. | 361/700 |
| 5,448,108 | * | 9/1995 | Quon et al. | 257/714 |
| 5,673,028 | * | 9/1997 | Levy | 340/635 |
| 5,900,738 | * | 5/1999 | Khandros et al. | 324/761 |

OTHER PUBLICATIONS

Tony Fang and Stephen Morris, "Conductive Polymers Prolong Circuit Life", Design News, Nov. 9, 1992.

* cited by examiner

Primary Examiner—Olik Chaudhuri
Assistant Examiner—Howard Weiss
(74) Attorney, Agent, or Firm—Heather L. Creps; Steven G. Parmelee; Lalita P. Williams

(57) ABSTRACT

The device (10) includes a semiconductor die (12) positioned to receive a fluid cooling medium (45) and a power input lead (25) attached to the semiconductor die. The power input lead having a characteristic such that at a first temperature a first current flows between the semiconductor die and the power input lead and at a second temperature a second current flows between the semiconductor die and the power input lead.

10 Claims, 1 Drawing Sheet

RADIO FREQUENCY ELECTRONIC DEVICE AND METHOD FOR REGULATING AN AMOUNT OF POWER DELIVERED TO A RADIO FREQUENCY ELECTRONIC DEVICE

FIELD OF THE INVENTION

This invention relates generally to electronics, and, more particularly, to an electronic device and to a method for regulating an amount of power delivered to a radio frequency electronic device.

BACKGROUND OF THE INVENTION

Electronic components such as integrated circuits, multi-chip modules, passive components and radio frequency (RF) power transistors may be heat sources which require cooling during normal operation.

Traditionally, electronic components have been cooled by conduction and natural or forced air convection. Advances in electronics, however, have resulted in some devices, such as radio frequency power devices, having power densities which exceed the capabilities of traditional natural or forced convective air cooling.

Two-phase cooling is an example of a thermal management technique which uses liquid coolants, rather than conductive, solid heat spreaders and air, to dissipate heat generated by electronic components. Evaporative spray cooling is a type of two-phase cooling which features the spraying of atomized droplets of a dielectric fluid such as a perfluorocarbon fluid directly or indirectly onto a surface of an electronic component such as a RF power transistor. When the fluid droplets impinge upon the transistor's surface, a thin film of liquid coats the transistor, and heat is removed primarily by evaporation and/or evaporation of the perfluorocarbon fluid from the transistor's surface.

Evaporative spray cooling is a preferred method of heat removal in many electronics applications, and perfluorocarbon dielectric fluids are generally chemically inert and stable. In the case of a malfunction of the spray cooling system or of the electronic component which is being cooled, however, temperatures of 250 degrees Celsius may be exceeded for a period of time, and toxic thermal decomposition products such as perfluoroisobutylene (PFIB) and hydrogen fluoride (HF) may be generated. And when components such as RF power transistors are being cooled, the risk of generating excessive temperatures may be increased due to high heat flux of these devices.

One well-known temperature-sensitive failure management system includes a logic circuit such as a microprocessor which communicates with a temperature sensor such as a thermocouple or thermistor. In operation, the thermocouple generates a signal corresponding to a temperature at a particular location and transmits the signal to the microprocessor. If the microprocessor determines that a predetermined temperature threshold has been exceeded, it may activate an alarm or interrupt a power supply.

Logic-based systems suffer from various problems. For example, such systems are dependent on the performance of the very electronics which they are intended to monitor— excessive temperatures could disable the system itself if thermal sensors located too close to the source of excessive heat are damaged or if the microprocessor is disabled due to high temperatures. Locating thermal sensors a safe distance away from the heat source, however, may delay notification that the predetermined temperature threshold has been reached. In addition, thermocouples and other sensors are electrical in nature and may therefore be incompatible with RF and other high-power devices because of electromagnetic interference effects.

Another common method for managing fluid cooling systems involves the use of special fluid filters which, in a closed system, convert a potentially dangerously decomposed fluid into a safe form. Special fluid filters are expensive, however, and may become saturated, and possibly unreliable, over time. Although chemical sensors which monitor for the presence of dangerous decomposition products such as PFIB and HF may also be utilized, such sensors may not be sensitive enough to protect human beings from the risk of exposure to dangerous substances.

Discrete devices, such as positive temperature coefficient (PTC) resistors, which significantly increase their resistance when an overcurrent condition develops, may not be compatible with RF devices and thus may have to be distanced from a perfluorocarbon fluid-cooled RF heat source. As such, PTC resistors may not react quickly enough to avert the potentially dangerous consequences of increases in temperature.

There is therefore a need for an electronic device and for a method for regulating an amount of power delivered to a radio frequency electronic component which reduces the safety risks associated with cooling the component using a fluid such as a perfluorocarbon fluid.

SUMMARY OF THE INVENTION

According to an aspect of the present invention, the foregoing needs are addressed by an electronic device which includes a semiconductor die positioned to receive a fluid cooling medium and a power input lead attached to the semiconductor die. The power input lead having a characteristic such that at a first temperature a first current flows between the semiconductor die and the power input lead and at a second temperature a second current flows between the semiconductor die and the power input lead.

According to another aspect of the present invention, a method for regulating an amount of power delivered to radio frequency (RF) electronic device includes providing a semiconductor die positioned to receive a fluid cooling medium; providing a power input lead attached to the semiconductor die; at a first temperature, delivering, based on a characteristic of the power input lead, an electrical current from the power input lead to the semiconductor die; and at a second temperature, based on the characteristic of the power input lead, reducing the electrical current delivered by the power input lead to the semiconductor die.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE PREFERRED EMBODIMENTS

Figure 1:
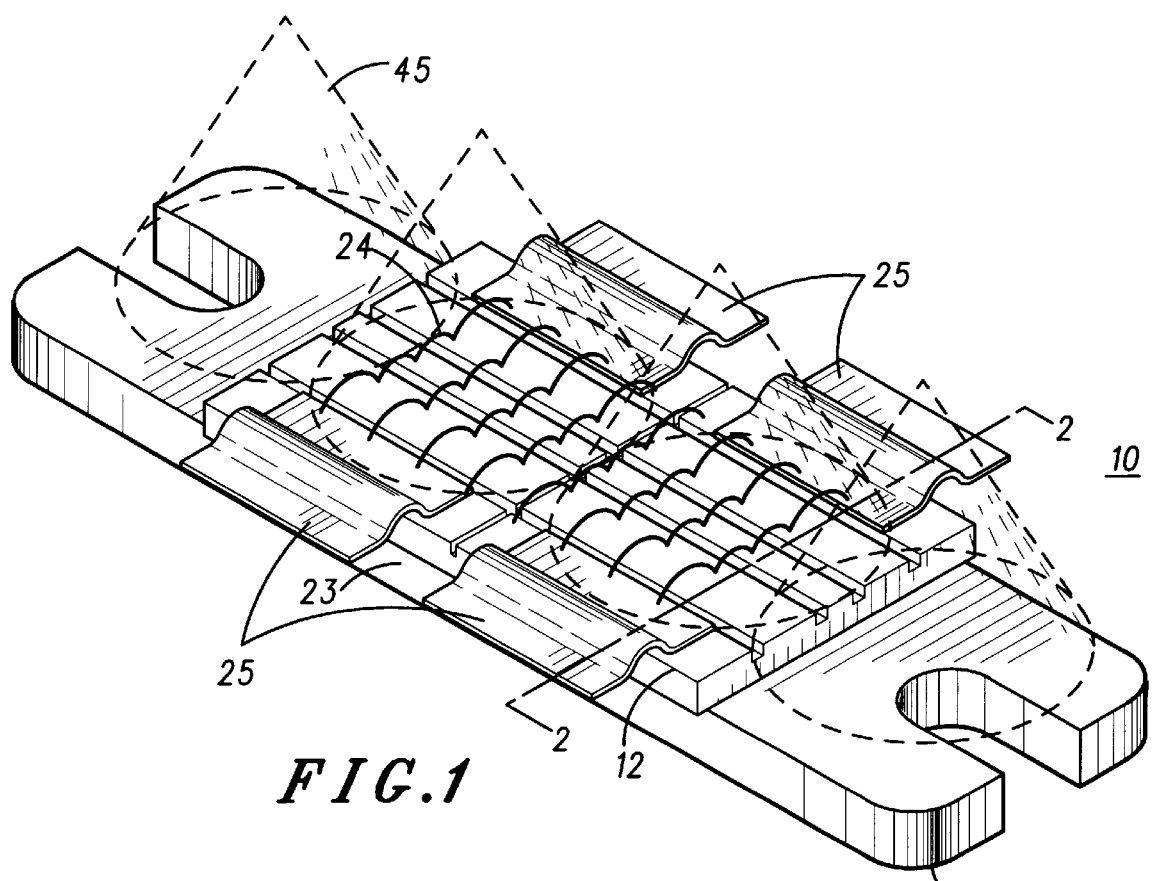
FIG. 1 is a plan view of an electronic device cooled via a two-phase cooling technique, having a power input lead constructed according to one embodiment of the present invention.

Turning now to the drawings, wherein like numerals designate like components, FIG. 1 is a plan view of a fluid-cooled electronic device 10 according to one embodiment of the present invention. As shown, electronic device 10 is an NPN Silicon Radio Frequency (RF) Power Transistor, available from Motorola, Inc., order number MRF899/D. References to electronic component 10 will be understood to apply not only to component 10 as depicted in FIG. 1, but also to differently-configured power transistors as well as to other electronic components such as integrated circuits, bipolar or field effect transistors or other devices.

Device 10 includes at least one transistor semiconductor die 12, disposed on a flange 13 or a substrate (not shown). Flange 13 may in turn be disposed on the substrate, which may be ceramic or another suitable material. The one or more transistor semiconductor dice 12 are referred to collectively herein as transistor 12.

As shown, transistor 12 has an exposed surface 23 having a number of wire bonds 24 thereon. It is contemplated, however, that solder bumps or other fixed-position contact structures such as flexible interconnects may be used in lieu of, or in addition to, wirebonds 24.

Electronic device 10 is cooled by atomized fluid 45. It is contemplated that any conventional means for providing flow of fluid 45 may be used in conjunction with the described embodiments of the present invention, although an evaporative spray-cooling system (not shown) having a closed-loop fluid flow is specifically contemplated herein. In such a system, one or more fluid-atomizing nozzles may positioned over transistor 12.

The nozzles may be miniature atomizers such as simplex pressure-swirl atomizers, which may be made of any suitable material. An example of a suitable material is a metal such as stainless steel or brass. Simplex pressure-swirl atomizers are described in detail in U.S. Pat. No. 5,220,804 to Tilton et al., incorporated herein by reference, and are commercially available from Isothermal Systems Research, Inc.

As shown, atomized fluid 45 from at least four nozzles is impinging upon transistor 12. The nozzles atomize the coolant fluid and discharge the atomized fluid directly onto exposed surface 23. When atomized fluid impinges 45 upon surface 23, a thin liquid film coats the surface, and heat is removed primarily by evaporation or boiling of the fluid from the surface. Excess fluid may be collected and removed according to well-known methods.

The coolant fluid may be any coolant, such coolants being well-known and widely available. One example of a suitable dielectric coolant is 3M's Fluorinert™ perfluorocarbon fluid, available from 3M, order number FC-72. Another perfluorocarbon fluid similar to 3M's Fluorinert™ fluid is available from Galden®.

A fluid pump may be used to deliver the fluid to the nozzles, and a condenser may be used to rejects heat from the fluid, returning it to primarily a liquid phase. Optionally, a fan may be used to extend the cooling capacity of the condenser. Cooled fluid may then be supplied from the condenser to the pump. Thus, a closed-loop flow of coolant would be formed. It will be appreciated that at any given point the coolant may be a vapor, a liquid or a vapor and liquid mixture.

Sizes of the fluid pump, the condenser and the fan should be selected based on heat removal and flow rate requirements. For example, a typical closed-loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

In accordance with a preferred embodiment of the present invention, one or more power input leads 25 is attached to transistor 12, preferably to exposed surface 23. It is contemplated that power input leads 25 may be an integral part of electronic component 10. Power input leads 25 supply a current and/or a voltage to transistor 12.

Figure 2:
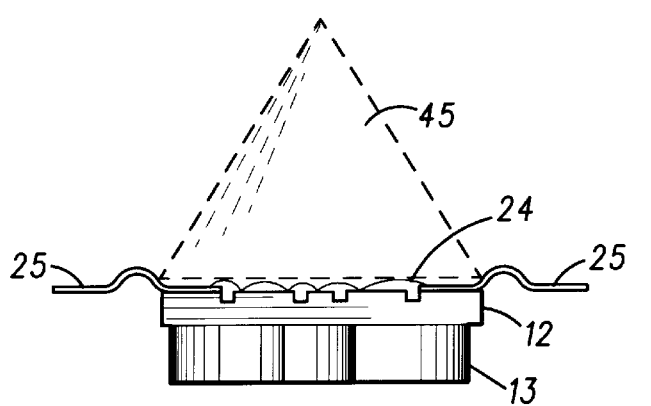
FIG. 2 is a front view along line 2—2 of the electronic device shown in FIG. 1.

FIG. 2 is a front view along line 2—2 of the electronic device shown in FIG. 1. Power input leads 25 preferably have a characteristic which allows them to efficiently supply a current to transistor 12 during normal operation, but which causes leads 25 to reduce the current flowing to transistor 12 when excessive heat is detected at or near leads 25. That is, during normal operation of transistor 12, leads 25 act as substantially closed circuits, and when a temperature above a predetermined threshold develops, leads 25 act as substantially open circuits. Leads 25 should not degrade the desired electrical performance of transistor 12 and should be solderable.

The predetermined temperature threshold at which leads 25 act as open circuits is preferably related to the temperature at which a cooling fluid, such as Fluorinert™ perfluorocarbon fluid, would decompose or otherwise become unstable. For example, the predetermined temperature threshold may be at or about the temperature at which the cooling fluid would decompose, or may be higher than such temperature. In the case of Fluorinert™ perfluorocarbon fluid, decomposition may occur, and potentially dangerous products such as perfluoroisobutylene (PFIB) and hydrogen fluoride (HF) may be generated, when temperatures remain at or about 250 degrees Celsius for an extended period of time. For example, decomposition begins at 250 degrees Celcius and may gradually increase over time and at higher temperatures.

In one aspect of the present invention, power input leads 25 are made in whole or in part of a fusible material, such as an indalloy fusible alloy available from Indium Corporation located in Clinton, N.Y. Leads 25 may also be plated in accordance with well-known methods with nickel, copper, gold or another metal to enhance solder wettability, electrical conductivity and corrosion protection.

At predetermined temperature thresholds (dependent on the particular indalloy alloy used to form leads 25), leads 25 melt, or fuse, and effectively create an open circuit to transistor 12. The fusing action removes power from transistor 12 at the time when the excessive temperature occurs, and thus prevents thermal decomposition of the cooling fluid. Examples of suitable indalloy alloy numbers include, but are not limited to, number one-hundred thirty-three and number three.

To further ensure that an open circuit is created between leads 25 and transistor 12 upon melting of leads 25, power input leads 25 may be formed in the shape of self-supporting arches. This geometry is illustrated in FIG. 2. When conditions are such that melting occurs on leads 25, the arched portion may become unstable and a clean break in the electrical path between leads 25 and transistor 12 will occur. Alternatively, leads 25 may be flat.

In another aspect of the present invention, power input leads 25 are made in whole or in part of a material, such as a positive temperature coefficient (PTC) material available from Raychem Corporation, which has reduced electrical conductivity when an overcurrent condition develops. When power is removed, the PTC's resistance returns to a value low enough to permit normal circuit operation.

In yet another aspect of the present invention, power input leads 25 are formed from a shape memory metal such as Nitinol, an alloy of nickel and titanium available from TiNi Alloy Company in San Leandro, California. A wire comprised of Nitinol changes crystal structure as it is warmed or cooled, so that if the wire is bent while cold, and then heated to a particular temperature, it will straighten. The remembered shape may be modified by annealing the wire. Thus, it is contemplated that input leads 25 may be formed so that when an excessive heat is applied to leads 25, leads 25 change shape to open the circuit between leads 25 and transistor 12.

Thus, simple and effective systems and methods have been described, which may be used to regulate an amount of power delivered to a radio frequency electronic component and to reduce the safety risks associated with cooling the component using a fluid such as a perfluorocarbon fluid. Providing a power input lead of a radio frequency power transistor which has a characteristic which allows it to act as a substantially closed circuit at one temperature and as a substantially open circuit at another temperature allows accurate tracking of the maximum temperature developed at or near the power transistor and prevents thermal decomposition of the fluid.

Although fluid cooling is specifically referred to herein, it is contemplated that any form of cooling may be utilized with the electronic device and method of the present invention, for example, air cooling and/or heat sinks and other types of cooling.

It is further contemplated that wherever sealing and/or fastening may be required, numerous methods and materials may be used. For example, fasteners such as screws, compliant gaskets, ultrasonic welding, brazing, soldering or swaging may be utilized.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An electronic device, comprising:
   a semiconductor die positioned to receive a fluid cooling medium, which fluid cooling medium decomposes when exposed to ambient temperatures at and above a decomposition temperature;
   a power input lead attached to the semiconductor die, the power input lead; allowing substantially unimpeded current flow to the semiconductor die at ambient temperatures less than the decomposition threshold; and
   substantially restricting current flow to the semiconductor die at ambient temperatures at and above the decomposition temperature; and
   such that, at ambient temperatures when the fluid cooling medium can decompose, less current flows to the semiconductor die to thereby reduce heat produced by the semiconductor die to thereby reduce a likelihood that the fluid cooling medium will decompose.

2. The electronic device according to claim 1, wherein an electronic path between the semiconductor die and the power input lead is a substantially closed circuit when the ambient temperature is below the decomposition temperature.

3. The electronic device according to claim 1, wherein an electrical path between the semiconductor die and the power input lead is a substantially open circuit when the ambient temperature is above the decomposition temperature.

4. The electronic device according to claim 1, wherein the fluid cooling medium comprises a perfluorocarbon fluid.

5. The electronic device according to claim 1, wherein he power input lead comprises a positive temperature coefficient material.

6. The electronic device according to claim 1, wherein the power input lead comprises an alloy of nickel and titanium.

7. The electronic device according to claim 1, wherein the semiconductor die comprises a radio frequency transistor.

8. The electronic device according to claim 1, wherein the power input lead is integral to the semiconductor die.

9. The electronic device according to claim 1, wherein the power input lead includes a self-supporting arched portion.

10. The electronic device according to claim 9, wherein the selfsupporting arched portion is solid when the ambient temperature is below the decomposition temperature and is at least partially melted when the ambient temperature is above the decomposition temperature.

* * * * *

UNITED STATES PATENT AND TRADEMARK OFFICE
CERTIFICATE OF CORRECTION

PATENT NO. : 6,215,166 B1  
DATED : April 10, 2001  
INVENTOR(S) : McDunn et al.

Page 1 of 1

It is certified that error appears in the above-identified patent and that said Letters Patent is hereby corrected as shown below:

<u>Column 6,</u>
Line 30 reads "he"; should read -- the --
Line 42 reads "selfsupporting"; should read -- self-supporting --

Signed and Sealed this

Eleventh Day of September, 2001

*Attest:*

Nicholas P. Godici

*Attesting Officer*

NICHOLAS P. GODICI
*Acting Director of the United States Patent and Trademark Office*